United States Patent
Deligianni et al.

(10) Patent No.: US 9,761,368 B2
(45) Date of Patent: Sep. 12, 2017

(54) LAMINATED STRUCTURES FOR POWER EFFICIENT ON-CHIP MAGNETIC INDUCTORS

(71) Applicant: INTERNATIONAL BUSINESS MACHINES CORPORATION, Armonk, NY (US)

(72) Inventors: Hariklia Deligianni, Alpine, NJ (US); William J. Gallagher, Ardsley, NY (US); Eugene J. O'Sullivan, Nyack, NY (US); Naigang Wang, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/978,353

(22) Filed: Dec. 22, 2015

(65) Prior Publication Data

US 2017/0178788 A1 Jun. 22, 2017

(51) Int. Cl.
| C23C 14/00 | (2006.01) |
| H01F 27/28 | (2006.01) |
| H01F 27/24 | (2006.01) |
| H01F 1/147 | (2006.01) |
| H01F 41/04 | (2006.01) |
| C23C 14/14 | (2006.01) |

(52) U.S. Cl.
CPC ......... *H01F 27/2804* (2013.01); *C23C 14/14* (2013.01); *H01F 1/14708* (2013.01); *H01F 27/24* (2013.01); *H01F 41/042* (2013.01); *H01F 2027/2809* (2013.01)

(58) Field of Classification Search
CPC . C23C 14/14; H01F 27/2804; H01F 1/14709; H01F 27/24; H01F 41/042; H01F 2027/2809
See application file for complete search history.

(56) References Cited

U.S. PATENT DOCUMENTS

| 6,838,740 B2 * | 1/2005 | Huai ...................... B82Y 25/00 257/295 |
| 8,018,011 B2 * | 9/2011 | Ranjan ................... G11C 11/16 257/421 |
| 2008/0191251 A1 * | 8/2008 | Ranjan ................... B82Y 10/00 257/295 |
| 2011/0006385 A1 * | 1/2011 | Zheng .................... B82Y 25/00 257/421 |

OTHER PUBLICATIONS

N. Wang, E. J. O'sullivan, P. Herget, B. Rajendran, L. E. Krupp, L.T. Romankiw, B. C.Webb, et. al, "Integrated on-chip inductors with electroplated magnetic yokes," J. Appl.,Phys. , 111, 07E732 (2012).
(Continued)

*Primary Examiner* — John Brayton
(74) *Attorney, Agent, or Firm* — Cantor Colburn LLP; Vazken Alexanian

(57) ABSTRACT

Disclosed are magnetic structures, including on-chip inductors comprising laminated layers comprising, in order, a barrier and/or adhesion layer, a antiferromagnetic layer, a magnetic growth layer, a soft magnetic layer, an insulating non-magnetic spacer, a soft magnetic layer, a magnetic growth later, an antiferromagnetic layer. Also disclosed are methods of making such structures.

5 Claims, 5 Drawing Sheets

| 3b (AF) |
| 4b (MG) |
| 5b (SM) |
| 6 (NM) |
| 5a (SM) |
| 4a (MG) |
| 3a (AF) |
| 2 (B/A) |

(56) References Cited

OTHER PUBLICATIONS

S. Bae, et al., "High Q Ni—Zn—Cu Ferrite Inductor for On-Chip Power Module," IEEETransaction on Magnetics, vol. 45, 4773.

X. Xing, M. Liu, S. Li, O. Obi, J. Lou, Z. Zhou, B. Chen, and N.X. Sun, "RF MagneticProperties of FeCoB/Al2O3/FeCoB Structure with VariedAl2O3 Thickness," IEEE Transactions on Magnetics, vol. 47, No. 10, (2011).

Y. Gao, S. Zarel, M. Onabajol, M. Lil, Z. Zhoul, T. Nanl, X. Yani, M. Liu, K. Mahalingam,B.M. Howe, John G. Jone, G.J. Brown, N. X. Sun, "Power-Efficient Voltage Tunable RFIntegrated Magnetoelectric Inductors with FeGaB/Al2O3 Multilayer Films," IEEE.

\* cited by examiner

| 3b (AF) |
|---|
| 4b (MG) |
| 5b (SM) |
| 6 (NM) |
| 5a (SM) |
| 4a (MG) |
| 3a (AF) |
| 2 (B/A) |

FIG. 1

LAMINATED STRUCTURES FOR POWER EFFICIENT ON-CHIP MAGNETIC INDUCTORS

STATEMENT OF GOVERNMENT INTEREST

This invention was made with Government support under Contract No.: N00014013-C-0167 awarded by Defense Advanced Research Projects Agency (DARPA). The Government has certain rights in this invention.

BACKGROUND

The present invention relates to magnetic structures, including magnetic yokes for inductors, and methods of making a magnetic inductor having low magnetic loss at high frequency capable of use for an on-chip power converter.

Thin film ferromagnetic inductors can be used as energy storage devices for ICs (integrated circuits). High energy storage is required for power management on chips. Miniaturization of magnetic inductors and integration on semiconductor chips requires the choice of high performance magnetic materials.

The integration of power converters onto a supporting substrate, for example silicon, is one path to reduce the cost, weight, and size of electronic devices. A challenge for developing fully integrated power converters, however, is the development of high quality thin film inductors. To be viable, the inductors should have high Q (Q factor or quality factor), large inductance, and/or large energy storage per unit area. Furthermore, it is necessary that such inductors employ magnetic materials that have soft magnetic properties with low coercive force (for example, an $H_c$ less than 1.0), high saturation magnetization, high resistivity (for example, greater than or equal to 110 mohm-cm) in order to reduce inductor losses at high frequencies from eddy currents. It is also desirable that such magnetic materials have excellent thermal stability with respect to processing temperatures that can be dictated by the integration process on-chip, for example, temperatures of about 250 to 300° C.

SUMMARY

An aspect of the present invention relates to a method of making a laminated magnetic structure comprising depositing, over a supporting substrate, a first sequence of layers comprising, in order, a barrier layer or an adhesion layer, a first antiferromagnetic layer, optionally a first magnetic growth layer, and a first soft magnetic layer; depositing an insulating non-magnetic spacer located between the first sequence of layers and a second sequence of layers; depositing a second sequence of layers comprising, in order, a second soft magnetic layer, an optional second magnetic growth layer, and a second antiferromagnetic layer, and pinning the first and second soft magnetic layers with, respectively, the first and second antiferromagnetic layers by subjecting the layers to annealing in a magnetic field at an elevated temperature.

Another aspect is directed to a laminated magnetic structure comprising, in order, the following layers, from a supporting substrate: a first sequence of layers comprising a barrier layer or an adhesion layer, a first antiferromagnetic layer, optionally a first magnetic growth layer, and a first soft magnetic layer, wherein the first soft magnetic layer is pinned by the first antiferromagnetic layer; an insulating non-magnetic spacer located between the first sequence of layers and a second sequence of layers; said second sequence of layers comprising a second soft magnetic layer, an optional second magnetic growth layer, and a second antiferromagnetic layer, wherein the second soft magnetic layer is pinned by the second antiferromagnetic layer.

Another aspect is directed to a laminated magnetic structure comprising, in order, the following layers, from a supporting substrate: a first sequence of layers comprising a barrier layer or an adhesion layer, a first antiferromagnetic layer, a first magnetic growth layer, and a first soft magnetic layer, wherein the first soft magnetic layer is pinned by the first antiferromagnetic layer; an insulating non-magnetic spacer located between the first sequence of layers and a second sequence of layers; said second sequence of layers comprising a second soft magnetic layer, a second magnetic growth layer, and a second antiferromagnetic layer, wherein the second soft magnetic layer is pinned by the second antiferromagnetic layer; wherein the first and second antiferromagnetic layers comprise a material independently selected from the group consisting of an alloy of manganese, an alloy comprising platinum and manganese, an alloy comprising iron and manganese, and an alloy comprising nickel and manganese, and wherein the first and second soft magnetic layers comprise a material independently selected from group consisting of CoFeB, CoFeNiB, FeB, CoFeRuB, CoFeRhB, CoFeRhB, CoFePtB, CoWB, CoWP, CoP, CoB, CoMoP, CoMoB, NiFe, NiFeB, NiFeCo, NiFeCo, and combinations thereof, wherein the first antiferromagnetic layer is in direct contact with the first magnetic growth layer, the first magnetic growth layer is in direct contact with the soft magnetic layer, and wherein the second antiferromagnetic layer is in direct contact with the second magnetic growth layer, and the second magnetic growth layer is in direct contact with the second soft magnetic layer; and wherein the magnetic structure has a Q factor of 10 to 20 at 20 MHz to 500 MHz and/or a magnetic loss tangent of 0.04 to 0.10 at 100 MHz.

Another aspect of the invention relates to a thin film inductor comprising conductive elements in association with a laminated magnetic structure comprising, in order, the following layers, from a supporting substrate: a first sequence of layers comprising a barrier layer or an adhesion layer, a first antiferromagnetic layer, a first magnetic growth layer, and a first soft magnetic layer, wherein the first soft magnetic layer is pinned by the first antiferromagnetic layer; an insulating non-magnetic spacer located between the first sequence of layers and a second sequence of layers; said second sequence of layers comprising a second soft magnetic layer, a second magnetic growth layer, and a second antiferromagnetic layer, wherein the second soft magnetic layer is pinned by the second antiferromagnetic layer, and wherein the magnetic layers form a planar inductor and have been formed by an integrated circuit fabrication type deposition process, and wherein the structure has a Q of 10 to 20 at 20 MHz to 500 MHz.

Yet another aspect relates to a system comprising the above-described inductors in association with an electronic device and a power supply or power converter incorporating the inductor on-chip, comprising said laminated magnetic structure, wherein the system comprises a microprocessor.

Other aspects and embodiments of the present invention will become apparent from the following detailed description, which, when taken in conjunction with the drawings, illustrate by way of example the principles of the invention

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 1 is a diagrammatic illustration of a magnetic structure comprising a plurality of laminated layers capable of use in the core or yoke of an inductor, in accordance with the present invention;

DETAILED DESCRIPTION

Figure 2:
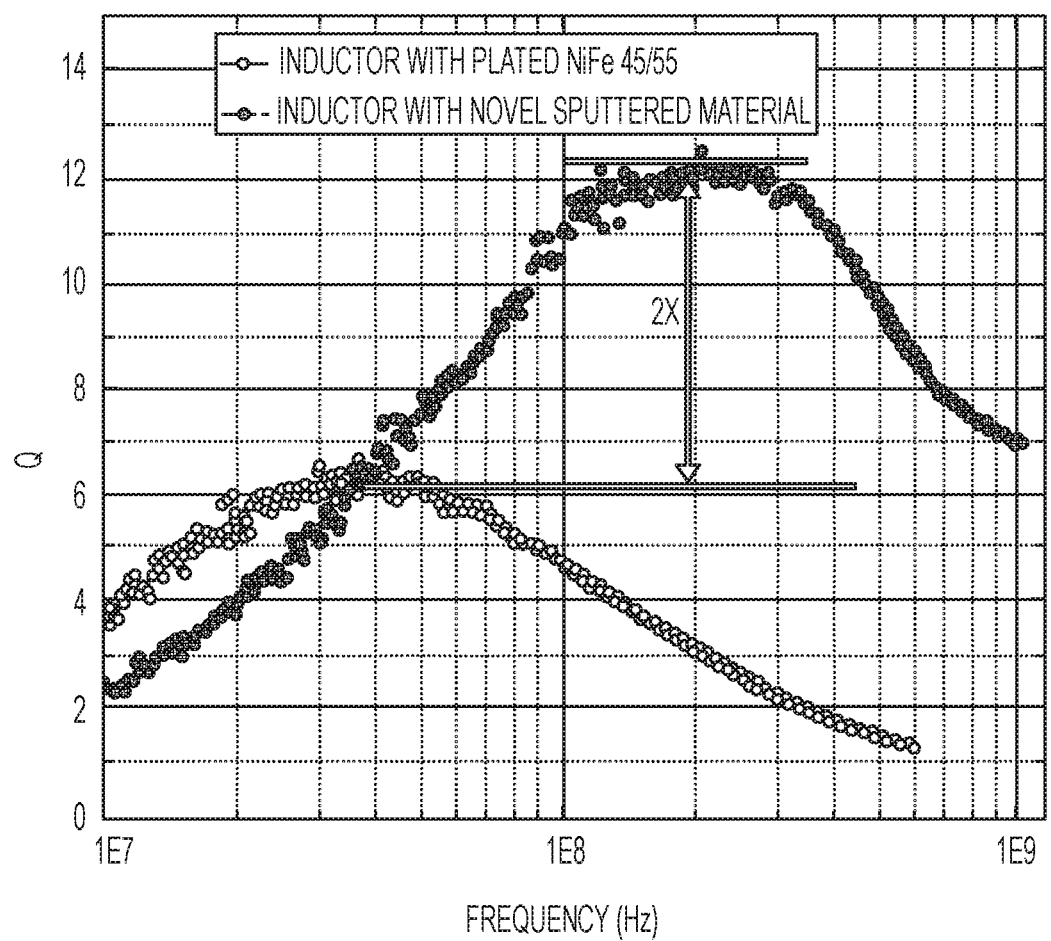
FIG. 2 is a graph comparing Q factor for one embodiment of an inductor, in accordance with the present invention, compared to a prior art inductor.

Detailed embodiments of the structures and methods of the present disclosure are described herein. It is to be understood, however, that the disclosed embodiments are merely illustrative of the disclosed structures and methods that may be embodied in various forms. In addition, each of the examples given in connection with the various embodiments of the disclosure is intended to be illustrative and not restrictive. Further, the figures are not necessarily to scale, and some features may be exaggerated to show details of particular components. Therefore, specific structural and functional details disclosed herein are not to be interpreted as limiting, but merely as a representative basis for teaching one skilled in the art to variously employ the methods and structures of the present disclosure. For the purposes of the description hereinafter, the terms "upper", "lower", "top", "bottom", "above, "below, and the like, and derivatives thereof shall relate to the disclosed structures, as they are oriented in the drawing figures. The same numbers in the various figures refer to the same structural component or, in some cases, part thereof.

Disclosed herein are magnetic structures comprising laminated films or layers and methods of making magnetic inductors with low magnetic loss at high frequency.

Typically, a single thin magnetic film can have a complicated magnetic domain structure. Since most on-chip devices are operated at high frequencies (greater than 20 MHz), large eddy currents can be induced within a magnetic core which can result in high alternating current (ac) losses at high frequency.

One way to reduce eddy currents is to laminate the magnetic core/yoke of an inductor with insulator spacers so that the eddy currents are confined within each magnetic layer. As the thickness of each layer gets thinner, the effective resistance of each magnetic layer becomes larger; hence, eddy currents are smaller.

Another function of magnetic lamination can be to control the magnetic domains. For on-chip planar inductors, magnetic anisotropy (i.e., with respect to both easy and hard axes) needs to be well defined. In particular, in their demagnetized state, magnetic domains in a magnetic layer can form a flux-closed configuration at the edges of the inductor. At relatively low frequency, the flux propagation (along the hard axis) is governed by both the magnetization rotation and domain wall movement.

The domain wall movement can induce local eddy currents which can add to the total loss in addition to hysteresis loss. At high frequency (greater than 100 MHz), mainly the magnetization rotation contributes to magnetic permeability, since wall movement of the domains is too slow. When an inactive fraction, parallel to the hard axis within the closure domains, fails to respond to fast magnetic field changes, high frequency permeability can be reduced.

In view of the above, elimination of closure domains can reduce magnetic loss and increase high frequency permeability, which is highly desirable for on-chip inductors. Closure domains can be eliminated by laminating the magnetic materials with a non-magnetic spacer layer as described herein. A magneto-static coupling between two adjacent magnetic layers through the non-magnetic spacer layer can remove closure domains.

According to some embodiments, the magnetic structure comprises, in order, a barrier layer and/or an adhesion layer, an antiferromagnetic layer, a magnetic growth layer, a soft magnetic layer, an insulating non-magnetic spacer, a soft magnetic layer, a magnetic growth later, and an antiferromagnetic layer. The layers can be in direct contact. Each layer, however, can be divided into a plurality of sub-layers. By "direct contact" is meant that a first element such as a first layer and a second element such as a second layer are in adjacent physical contact, without any intermediary layers at the interface of the two elements. However, an intervening layer can be present if it does not adversely affect the functional relationship of the required layers.

Also disclosed herein are methods of an inductor comprising a laminated structure comprising, in order, a barrier layer and/or adhesion layer, an antiferromagnetic layer, a magnetic growth layer, a soft magnetic layer, an insulating non-magnetic spacer, a soft magnetic layer, a magnetic growth later, and an antiferromagnetic layer, wherein the laminated structure forms a yoke or core structure for an inductor, wherein the material for each layers is deposited on an insulator which, in turn, is supported by a substrate, and wherein a hard mask is applied over the deposited layers, which is then patterned to select a yoke structure, followed by encapsulation of the magnetic structure and fabrication of a copper coil, and wherein the magnetic layers are pinned by the antiferromagnetic layer by annealing the layer of yoke or core structure at an elevated temperature.

Figure 1:
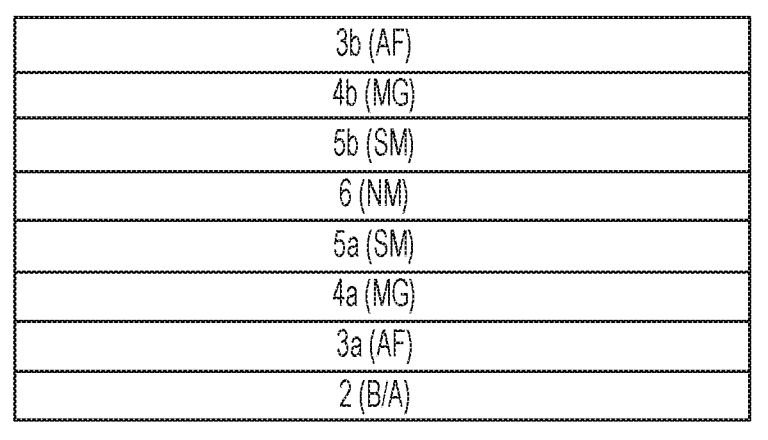

Referring to FIG. 1, an embodiment of a magnetic structure 1 is illustrated, which structure comprises laminated layers. A barrier and/or adhesive (B/A) layer 2 can be attached directly or indirectly to a supporting substrate, for example, silicon. A barrier material can comprise, for example, tantalum (Ta), tantalum nitride (TaN), titanium (Ti), titanium nitride (TiN), chromium (Cr), molybdenum (Mo), molybdenum nitride (MoN), tungsten (W), tungsten nitride (WN), or other suitable adhesive/barrier material. The thickness of the barrier and/or adhesive layer 2 can be in a range from 1 nanometers (nm) to 100 nm, more specifically about 5 nm to about 50 nm. The magnetic structure can have an adhesive ("seed") layer and a barrier layer or a single layer that serves both functions at the same time or a sequence of sub-layers can be deposited.

Above the barrier/adhesion layer 2 is a first antiferromagnetic layer 3a (AF). Antiferromagnetic materials are materials having magnetic moments of atoms or molecules, usually related to the spins of electrons that align in a regular pattern with neighboring spins, on different sub-lattices, pointing in opposite directions. Generally, antiferromagnetic order may exist at sufficiently low temperatures, vanishing at and above a certain temperature, the Néel temperature. Below the Néel temperature, the antiferromagnetic material is ordered and above it, disordered. When no external magnetic field is applied, the antiferromagnetic material corresponds to a vanishing total magnetization.

Accordingly, the material in antiferromagnetic layer $3a$ can couple to the ferromagnetic material in soft magnetic layer $5a$, for instance, through a mechanism known as exchange anisotropy (for, example, wherein an aligning magnetic field is applied either when a ferromagnetic film is grown upon the antiferromagnetic film or during subsequent annealing) causing the surface atoms of the ferromagnetic layer to align with the surface atoms of the antiferromagnetic layer. This provides the ability to pin the orientation of the ferromagnetic layer or film. The temperature at or above which an antiferromagnetic layer loses its ability to pin the magnetization direction of an adjacent ferromagnetic layer is called the blocking temperature of that layer and is usually lower than the Néel temperature The first antiferromagnetic layer $3a$ can comprise, may comprise, for example, an alloy of manganese (Mn) such as an alloy comprising iridium and manganese (IrMn), an alloy comprising platinum and manganese (PtMn), an alloy comprising iron and manganese (FeMn), and an alloy comprising nickel and manganese (NiMn), $Mn_3ZnN$, NiO, or other suitable antiferromagnetic material.

In some embodiments, the first antiferromagnetic layer $3a$ has a thickness of 1 to 100 nm, specifically 10 to 100 nm. The first antiferromagnetic layer $3a$ is located between the adhesion/barrier layer $2$ and a first magnetic growth layer $4a$ to be described, and can be in direct contact with the first magnetic growth layer $4a$ or in direct contact with both the adhesion/barrier layer $2$ and the magnetic growth layer $4a$.

The first magnetic growth (MG) layer $4a$ can comprise a cobalt-based layer, for example, CoFe or CoFeNb, CoFeZr, among others. In some embodiments, the magnetic growth layer has a thickness of 1 to 100 nm, specifically 1 to 10 nm. The first magnetic growth layer $4a$ is located between the first antiferromagnetic layer $3a$ and a first soft magnetic layer $5a$ to be described, and can be in direct contact with the first antiferromagnetic layer $3a$ or both the first antiferromagnetic layer $3a$ and the first soft magnetic layer $5a$. The magnetic growth (MG) layer is used to enhance the coupling between antiferromagnetic and soft magnetic layers, which is optional.

The first soft magnetic (SM) layer $5a$ can comprise Cobalt-Iron-Boron (CoFeB) materials, i.e. materials comprising cobalt, boron, and/or boron, and combinations thereof. In some embodiments, the proportion of Cobalt atoms in the soft magnetic layer is up to about 50 percent. Other examples of soft magnetic material are CoFeNiB, FeB, FeP, CoFeRuB, CoFePtB, CoWB, CoWP, CoP, CoB, CoMoP, CoMoB, NiFe, NiFeB, NiFeB, NiFeCo, NiFeCo, and the like. In some embodiments, the first soft magnetic layer $5a$ (SM) has a thickness of 1 to 1000 nm, specifically 20 to 400 nm, more specifically 50 to 200 nm. The first soft magnetic layer $5a$ is located between the first magnetic growth layer $4a$ and an insulating non-magnetic spacer layer $6$ to be described and can be in direct contact with the first magnetic growth layer $4a$ or both the first magnetic growth layer $4a$ and the insulating non-magnetic spacer layer $6$.

The insulating non-magnetic (NM) spacer layer $6$ can comprise $Al_2O_3$, MgO, $SiO_2$, $Si_3N_4$, $HfO_2$, $Ta_2O_5$, other insulating dielectric thin films, and combinations thereof. It is desirable that the non-magnetic insulating lamination layers are pinhole free in order to be capable of allowing interlayer anti-ferromagnetic coupling between the magnetic thin films.

In some embodiments, the insulating non-magnetic spacer layer $6$ has a thickness of about 1 to 1000 nm, specifically 10 to 400 nm, and more specifically 10 to 100 nm. The insulating non-magnetic spacer layer $6$ is located between the first soft magnetic layer and the second soft magnetic layer to be described, and can be in direct contact with the first soft magnetic layer $5a$ or both the first soft magnetic layer $5a$ and the second first soft magnetic layer $5b$.

Above the insulating non-magnetic (NM) spacer layer $6$ is a second soft magnetic layer $5b$ which can comprise can comprise CoFeB materials, i.e. materials comprising cobalt, boron, and/or boron, and combinations thereof. The second soft magnetic layer $5b$ can comprise the same material as, or a different material than, the first soft magnetic layer and can have a thickness within the same range, but independently varying, as the thickness of the first soft magnetic material. The second soft magnetic layer is located between insulating non-magnetic spacer layer $6$ previously described and a second the magnetic growth layer $4b$ to be described and can be in direct contact with the second magnetic growth layer $4b$ or both the second magnetic growth layer $4b$ and the insulating non-magnetic spacer layer $6$.

The second magnetic growth layer $4b$, like the first magnetic growth layer $4a$, can independently comprise a cobalt-based layer, for example, CoFe, NiFe, CoFeZr, or CoFeNb, among others. In some embodiments, the second magnetic growth layer $4b$ has a thickness within the same range as that of the first magnetic growth layer but independently varying within that range. The second magnetic growth layer $4b$ is located between the second soft magnetic layer $5b$ and a second antiferromagnetic layer $3b$ to be described and can be in direct contact with the second soft magnetic layer $5b$ or both the second soft magnetic field $5b$ and the second antiferromagnetic layer $3b$. The second magnetic growth layer $4b$ can comprise the same or different material than the first magnetic growth layer $4a$ and can have about the same thickness as, or a different thickness than, the first magnetic growth layer.

Above the second magnetic growth layer $4b$ is a second antiferromagnetic layer $3b$. The second antiferromagnetic layer $3b$ can independently comprise, for example, an alloy of manganese (Mn) such as an alloy comprising iridium and manganese (IrMn), an alloy comprising platinum and manganese (PtMn), an alloy comprising iron and manganese (FeMn), an alloy comprising nickel and manganese (NiMn), $M_3ZnN$, NiO, or other suitable antiferromagnetic material. In some embodiments, the second antiferromagnetic layer $3b$ has a thickness within the same range as that of the first antiferromagnetic layer $3a$, but can independently vary within that range. The second antiferromagnetic layer $3b$ is located over the second magnetic growth layer $4b$ and can be in direct contact with the second magnetic growth layer $4b$. The second antiferromagnetic layer $3b$ can comprise the same material as, or a different material than, the first antiferromagnetic layer $3a$ and can have about the same thickness as, or a different thickness than, the first antiferromagnetic layer $3a$.

The magnetic structure of FIG. 1 can have a further sequence of layers comprising an additional series of layers in which an additional insulating non-magnetic spacer layer is deposited over the second antiferromagnetic layer and an additional soft magnetic layer, additional magnetic growth layer, and an additional antiferromagnetic layer, as described for the respective second layers, are deposited, in order, over the additional insulating non-magnetic spacer layer. Such sequence can be repeated any number of suitable times, for example 2 to 100 times, optionally with intervening structures or layers, to obtain the desired thickness for a magnetic structure or yoke capable of use in an inductor.

In particular, according to some embodiments, a magnetic structures, specifically magnetic inductors, can have High Q (for example, Q=10 to 20, specifically 12-13) at 20 MHz to 500 MHz frequency and can be fabricated using anti-ferromagnetically (AF) pinned layers on both sides in a multilayer laminate structure comprising, in sequence the following layers: AF layer/magnetic growth layer/ferromagnetic layer/non-magnetic insulation layer/ferromagnetic layer/magnetic growth layer/AF layer.

FIG. 2 is a graph depicting the improvement in Q factor of a laminated magnetic structure, according to an embodiment of the invention, comprising a multilayer laminated structure that is 0.816 nm in thickness consisting of, in sequence, layers of Ir/Mn/$Co_{90}Fe_{10}$/$CO_{20}Fe_{60}B_{20}$/(10 nm MgO or 1.4 nm $Al_2O_3$), compared to a prior art magnetic structure consisting of $Ni_{45}Fe_{55}$. The present laminated magnetic structure can be further improved with further sequences of layers to obtain a thickness two to four times greater. Q factor, or Quality factor, of an inductor is the ratio of its inductive resistance to its resistance at a given frequency and is a measure of its efficiency.

Figure 3:
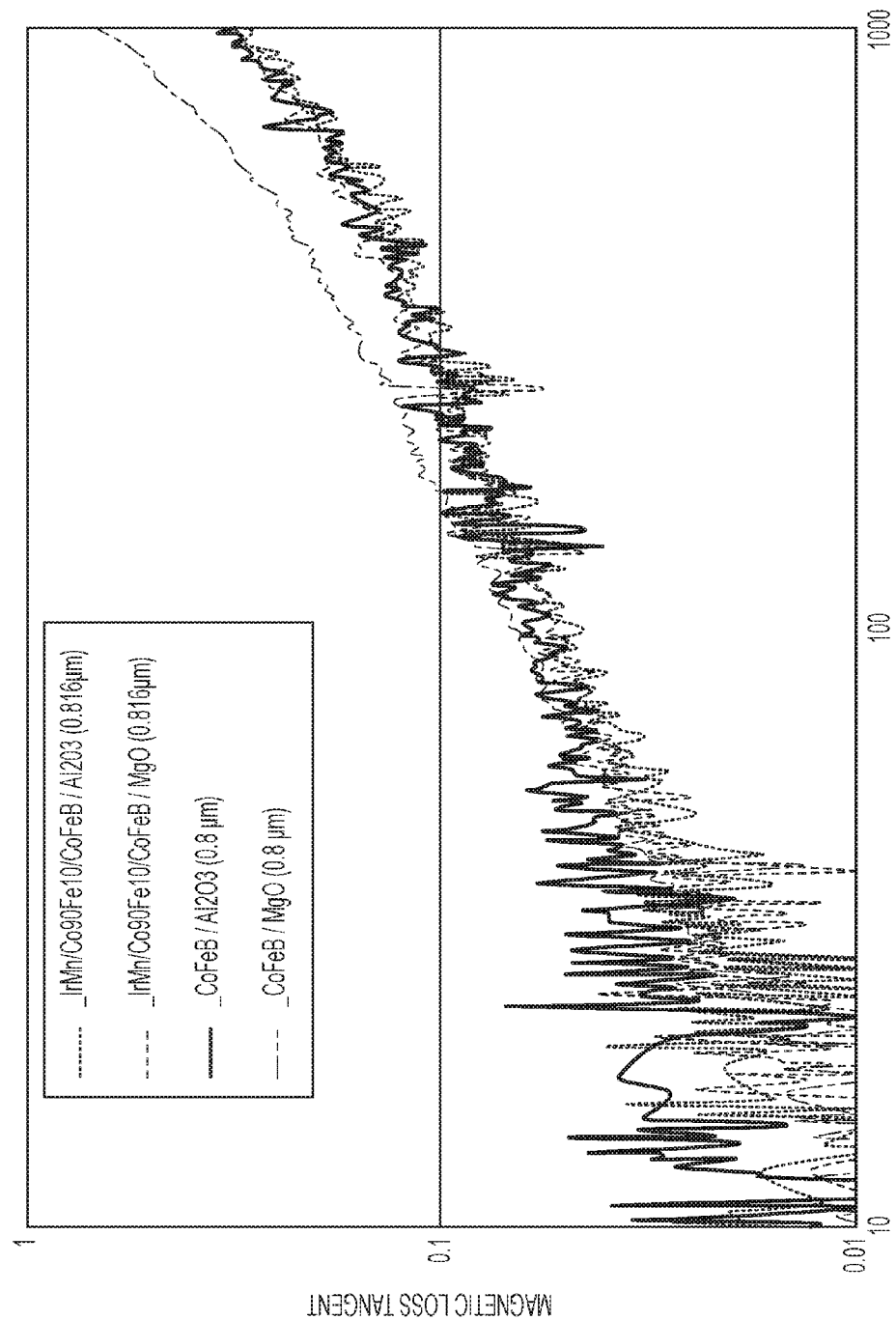
FIG. 3 is a graph comparing magnetic loss tangent to frequency (MHz) for one embodiment of an inductor, in accordance with the present invention, to other inductors, in accordance with the present invention, compared to a prior art inductor.

FIG. 3 is a graph depicting magnetic loss tangent of various of a laminated magnetic structures (as indicated in the graph) and shows, for comparison to present embodiments, the magnetic loss tangent of laminated magnetic structures lacking the antiferromagnetic layer and interface layers of present embodiments. At higher frequencies, the improvement in magnetic loss (i.e., a lower amount) is evident for the present embodiments.

Figure 4:
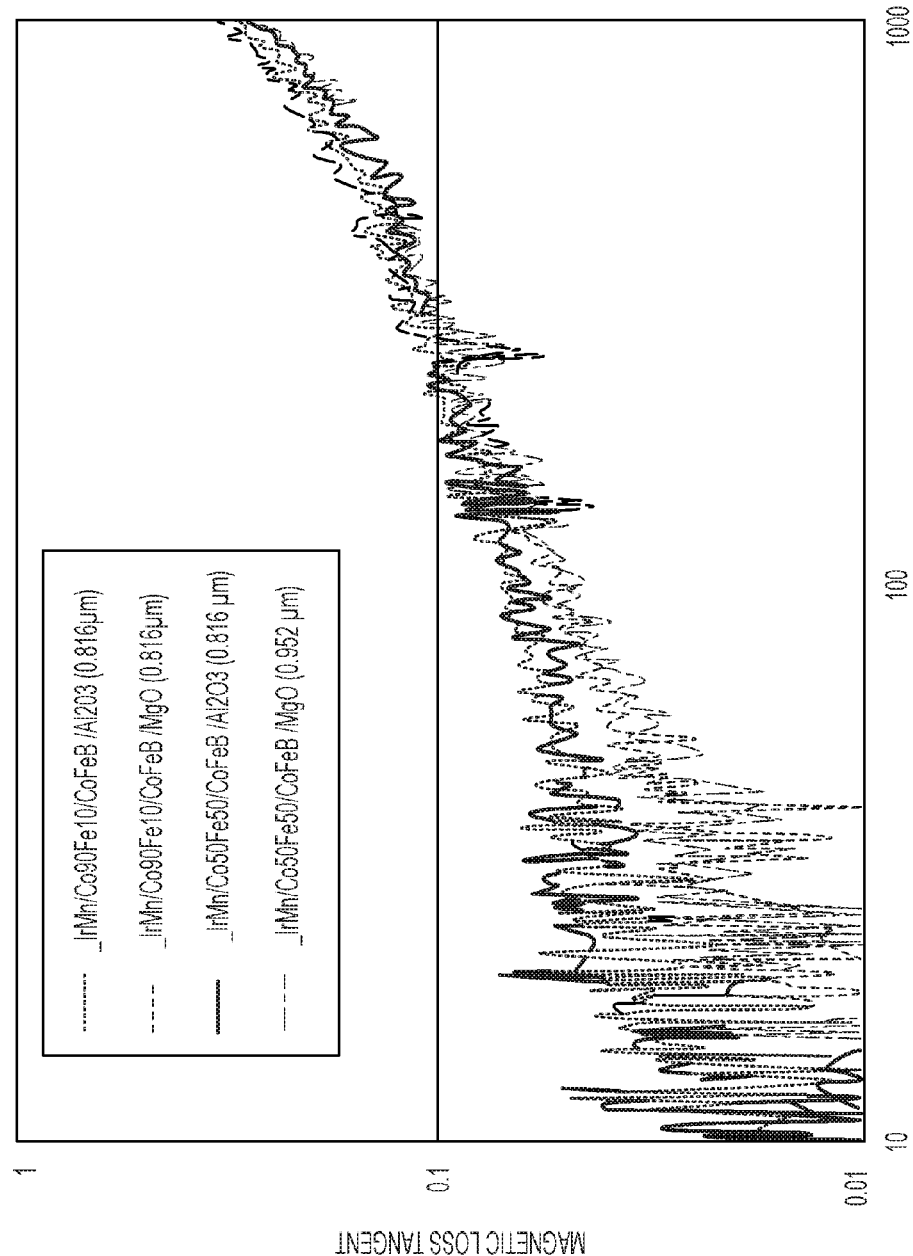
FIG. 4 is a graph comparing magnetic loss tangent to frequency (MHz) for one embodiment of an inductor, in accordance with the present invention, to other inductors, in accordance with the present invention, compared to a prior art inductor.

FIG. 4 shows the improvement in magnetic loss (i.e., a lower amount) for s embodiments of the laminated magnetic structures, using various non-magnetic interface layers (MgO or $Al_2O_3$) and interface layers ($Co_{50}Fe_{50}$ or $Co_{90}Fe_{10}$).

The magnetic growth layer can also be referred to as an "interface" layer or "magnetic interface layer." The soft magnetic layer can also be referred to as a "ferromagnetic layer" or "magnetic layer" herein. Finally, the combination of the ferromagnetic layer and the most adjacent magnetic growth layer can be referred to as a "ferromagnetic composite layer" or "magnetic composite layer."

Such magnetic structures and magnetic materials can be applied to the building of magnetic yokes for inductors, specifically planar inductors, more specifically solenoid or spiral inductors The magnetic growth layer and the soft magnetic layer, in combination, can be referred to as a ferromagnetic composite layer. Applicants have found that, beneficially with respect to anti-ferromagnetic/ferromagnetic/non-magnetic/ferromagnetic/anti-ferromagnetic multilayers disclosed herein, which use anti-ferromagnetically pinned ferromagnetic multilayers, that both the hard axis anisotropy field ($H_k$) and the ferromagnetic resonance of the resulting multilayered structure can be modulated and can be pushed to higher frequencies. As a result, the magnetic loss tangent of the multilayered structures can be lowered at both 100 MHz and up to 1 GHz frequencies. Such anti-ferromagnetic layers can use materials such as IrMn, NiMn.

Furthermore, consistent production of inductors and magnetic structure disclosed here can be obtained, for example, as measured for performance across a 200 mm wafer. Thus, the present structures can be obtained with a high wafer yield, potentially yielding functional inductors on all chips.

Specific examples of magnetic structures as described can include, but are not limited to IrMn/$Co_{90}Fe_{10}$/$Co_{20}Fe_{60}B_{20}$/ 10 nm MgO (0.816 μm) and IrMn/$Co_{90}Fe_{10}$/$Co_{20}Fe_{60}B_{20}$/ 1.4 nm $Al_2O_3$ (0.816 μm). They can provide a high inductor $Q_{peak}$ of about 12 at 120 MHz to 250 MHz and Q at about 11 at 100 MHz.

Specifically, a CoFeB magnetic layers can be sputtered to a thickness of 0.25 to 5 μm, specifically 0.5 to 3, more specifically 0.8 to 2 μm. The magnetic layer can be sputtered on a non-magnetic spacer layer and/or pinned with an antiferromagnetic layer. Multiple CoFeB magnetic layers can be sputtered and integrated for building on-chip inductors. CoFeB magnetic layers laminated with $Al_2O_3$ or with MgO, for example, can have a magnetic loss tangent of 0.06 to 0.07 at 100 MHz.

It has also been found that the loss tangent of a magnetic stack as described (measured at about 0.9 μm) comprising multiple sequences of a multilayer laminate comprising an AF layer (IrMn)/Interface Layer ($Co_{90}Fe_{10}$ or $Co_{50}Fe_{50}$) layer/CoFeB Ferromagnetic Layer pinned with the IrMn antiferromagnetic layer and laminated with $Al_2O_3$ or with MgO, can depends upon the magnetic interface layer.

Specifically, films with a magnetic interface comprising $Co_{90}Fe_{10}$ have been found to provide a loss of 0.05 at 100 MHz versus a loss of 0.07 at 100 MHz for a comparable stack with a magnetic interface comprising $Co_{50}Fe_{50}$. Relevant experimental results are shown in Table 1 below.

TABLE 1

| Magnetic Material | $H_c$ (Oe) Hard Axis | $H_k$ (Oe) Hard Axis | Magnetic loss tangent at 100 MHz | Magnetic loss tangent at 1 GHz |
|---|---|---|---|---|
| CoFeB (60 nm) | 0.98 | 18 | 0.08 | 0.16 |
| CoFeB 100 nm/1.4 nm $Al_2O_3$ (0.800 μm) | 0.4 | 20 | 0.063 | 0.34 |
| CoFeB 100 nm/2.8 nm $Al_2O_3$ (0.800 μm) | 0.425 | 20 | 0.068 | 0.5 |
| CoFeB 100 nm /10 nm MgO (0.800 μm) | 0.394 | 25 | 0.069 | 0.70 |
| IrMn/$Co_{90}Fe_{10}$/CoFeB/1.4 nm $Al_2O_3$ (0.816 μm) | 1.17 | 35 | 0.055 | 0.33 |
| IrMn/$Co_{90}Fe_{10}$/CoFeB/10 nm MgO (0.816 μm) | 1.04 | 37 | 0.050 | 0.36 |
| IrMn/$Co_{50}Fe_{50}$/CoFeB/1.4 nm $Al_2O_3$ (0.816 μm) | 1.38 | 50 | 0.070 | 0.3 |
| IrMn/$Co_{50}Fe_{50}$/CoFeB/10 nm MgO (0.952 μm) | 1.66 | 50 | 0.062 | 0.33 |

As evident by the results in Table 1, sputtered CoFeB laminated magnetic multilayers 0.8 to 1 μm thick comprising non-magnetic spacer layers and or pinned with antiferromagnetic layers can be integrated for building on-chip inductors. CoFeB magnetic layers laminated with $Al_2O_3$ or with MgO have a magnetic loss tangent of 0.06 to 0.07 at 100 MHz. The loss tangent for stacks comprising AF (IrMn)/ Magnetic Interface ($Co_{90}Fe_{10}$ or $Co_{50}Fe_{50}$)/CoFeB multilayers pinned with IrMn antiferromagnetic layers and laminated with $Al_2O_3$ or with MgO can depend upon the magnetic interface layer. In the above experiments, films with an magnetic interface comprising $Co_{90}Fe_{10}$ provided a loss of 0.05 at 100 MHz versus 0.07 at 100 MHz for a comparable stack comprising, as a magnetic growth interface layer, $Co_{50}Fe_{50}$.

In some embodiments, a thin film coupled inductor using the above-described magnetic structure can comprise a wafer substrate and a yoke comprising the magnetic structure supported by the wafer substrate. A thin film inductor can include a wafer substrate of any type known in the art, e.g., silicon, AlTiC, glass, etc.; and a yoke above the wafers substrate.

Specifically, a spiral inductor or a coupled inductor can include any of the magnetic structures described above, including any other magnetic structures which would be apparent in various embodiments to one of skill in the art upon reading the present description.

The inductor can have two or more yokes comprising a laminated magnetic structure, for example, a bottom yoke and a top yoke, wherein a first conductor is situated above the bottom yoke and separated therefrom by a first insulating layer, a second conductor above the first insulating layer; and a third insulating layer above the second conductor. Insulating layers can comprise alumina, silicon oxides, resists, polymers, etc. or any other insulating material known in the art. Mere exemplary inductors with copper coil are disclosed in commonly assigned U.S. Pat. No. 9,047,890 and US 2013/0176095.

In yet another general embodiment, a system or electronic device can comprise a power supply or power converter incorporating an inductor comprising a laminated magnetic structure as described above.

A conductor in an inductor can include any conductor material known in the art or any other conductive material which may be apparent in various applications to one of skill in the art upon reading the present description. In some embodiments, at least one of the conductors can have a spiral shape. Moreover, any number of spiral turns can be used, such as 2 to 20. In various approaches, the yokes as well as the conductors can be formed by any suitable thin film processing techniques, including sputter deposition or any other thin film process known in the art.

In one approach, a system may include an electronic device; and a power supply or power converter incorporating a thin film inductor. In various embodiments, such electronic device can include a circuit or component thereof, chip or component thereof, microprocessor or component thereof, application specific integrated circuit (ASIC), etc. In further embodiments, the thin film inductor and the electronic device are physically constructed on a common substrate. Thus, in some approaches, the thin film inductor can be integrated in a chip, microprocessor, ASIC, etc.

In another approach, a thin film inductor may be formed on a first chip that is coupled to a second chip having an electronic device. For example, the first chip can act as an interposer between the power supply, power source, or converter and the second chip. The first and/or second chip can incorporate any of the chips mentioned herein, including, but not limited to chips for mobile telephones, computers, personal digital assistants (PDAs), portable electronic devices, etc. or any other chip which would be apparent in various embodiments to one of skill in the art upon reading the present description. Moreover, the power supply or converter can include a power supply line, a transformer, etc.

Additional applications, according to various embodiments include power conversion for LED lighting, power conversion for solar power, etc. For example, one illustrative application can include a solar panel, a power converter having an inductor as described herein, and a battery. Moreover, in use, any of the thin film inductor embodiments disclosed herein can be used in any application in which an inductor is useful on-chip.

In particular, the present magnetic structures can be fully integrated on a silicon chip, on an interposer with TSV (through silicon via) technology, on an GaN chip, on an InP chip or with any other technology and circuit environment. In contrast to the present inductors, ferrite inductors integrated on PC boards are bulky components and cannot be integrated on-chip. Similarly, tunable magnetoelectric inductors with magnetic laminated materials that include a piezoelectric slab for tunability lack the ability to be fully integrated on chips, unlike the present structures and materials comprising pinned magnetic films.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

An embodiment of a method of making an inductor according to the invention will now be described with reference to FIGS. 5A to 5E. In part (a) of the method illustrated in FIG. 5A, a substrate 10 for the inductor is provided, comprising a silicon wafer 11 with front-end devices and standard back-end-of-the line (BEOL) copper 12 in an insulating layer 13. In part (b) of the method, illustrated in FIG. 5B, magnetic layers can be sputtered over the substrate 11 to form intermediate structure 14 having the necessary magnetic layers 15 for an inductive yoke.

Figure 5A:
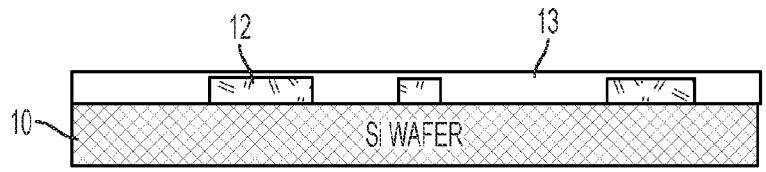
FIGS. 5A, 5B, 5C, 5D, and 5 E progressively illustrate one embodiment of a method of making an inductor according to the present invention.
Figure 5B:
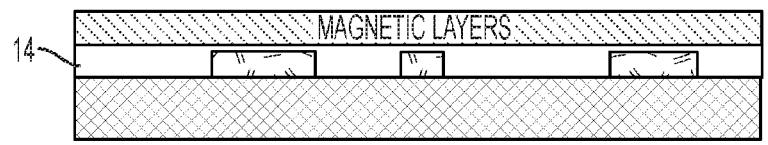

In the method of FIG. 5B, the layers in the laminated magnetic structure as described above can be deposited in sequence. For example, CoFeB materials can be beam sputtered to form a laminated magnetic structure 0.8 to 1 μm thick with non-magnetic spacer layers and pinned with antiferromagnetic layers. The respective thicknesses of antiferromagnetic and magnetic layers of the laminated magnetic structure can be controlled by their respective deposition times. Most deposition techniques can control layer thickness within a few tens of nanometers. In addition to sputtering and other physical vapor deposition, other deposition techniques can include chemical vapor deposition (CVD), plasma enhanced CVD (PECVD), atomic layer deposition (ALD), and the like.

The sputtered ferromagnetic (soft magnetic) layers and sputtered antiferromagnetic layers can be post-annealed at an elevated temperature in a bias field to pin the layers. Specifically, for example, the deposited layers can be post-annealed at about 300° C. at one Tesla for one hour.

Figure 5C:
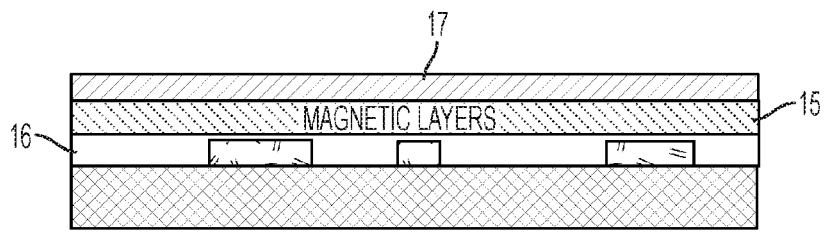

In part (c) of the method, as illustrated in FIG. 5C, the intermediate structure 14 can then be blanketed with a dieletric hard mask, for example, a nitride such as silicon nitride or an oxide such as silicon oxide to form intermediate structure 16 comprising hard mask 17. The hard mask layer 17 can then be patterned and etched to form intermediate structure 18, as illustrated in FIG. 5D.

Such etching can be accomplished by an anisotropic etch process. Anisotropic etching is a material removal process in which the etch rate in the direction normal to the surface to be etched is greater than in the direction parallel to the surface to be etched. Such an anisotropic etch can include reactive-ion etching (RIE) or crystallographic wet etch. Other examples of anisotropic etching that can be used include ion beam etching, plasma etching, or laser ablation.

Figure 5D:
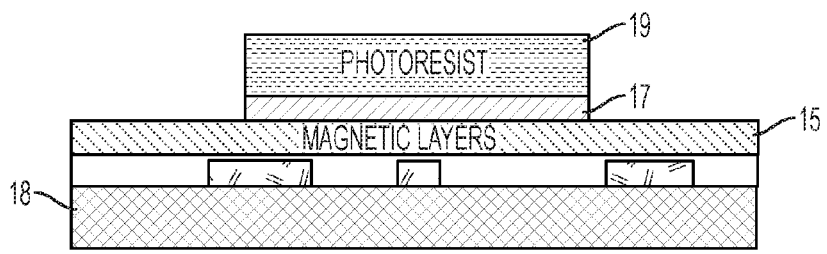

In part (d) of the method, as illustrated in FIG. 5D, a photoresist mask can be applied over laminated magnetic structure 15. The hard mask can be patterned using a photoresist 19 and reactive ion etch (RIE). After etching the hard mask, the remaining photoresist mask 19 can be stripped.

Specifically, and in one example, a pattern in the hard mask can be produced by applying the photoresist mask to the surface to be etched, exposing the photoresist to a pattern of radiation such as RIE etching or crystallographic wet etch, and then developing the pattern into the photoresist utilizing a resist developer. Once the patterning of the photoresist mask is completed, the selected sections of the hard mask 17, later used to determine the dimensions of the yoke structure, is protected by the photoresist, while the exposed regions are removed using the selective etching process that removes the unprotected regions.

Figure 5E:
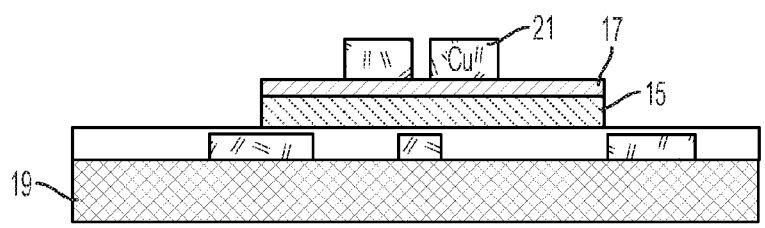

In part (e) of the method, as illustrated in FIG. 5E, etching (for example, REI ion beam etching) can be employed to pattern the magnetic layers to form a yoke structure, using the patterned hard mask. The resulting intermediate structure can be optionally coated or encapsulated with a dieletric or insulating material (not shown), and planarized, employing CMP (chemical-mechanical planarization). Finally, in part (e) of the method of FIG. 5E, copper coils 21 can be fabricated, as will be appreciated by one of ordinary skill in the art, to complete formation of an inductor.

As mentioned above, the thin film ferromagnetic inductors thus fabricate can be used as energy storage devices for ICs on a chip. The present inductors can comprise magnetic materials having soft magnetic properties with low coercive force ($H_c$<1.0). Coercivity is a measure of the ability of a ferromagnetic material to withstand an external magnetic field without becoming demagnetized. Materials with low coercivity, or $H_c$, are magnetically soft. In addition, the magnetic materials can have soft magnetic properties with high saturation magnetization and high resistivity (r>=110 mohm cm) to reduce inductor losses at high frequencies from eddy currents. The inductors can have excellent thermal stability to a processing temperature that is dictated by the integration process on-chip, for example about 250 to 350° C.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of making a laminated magnetic structure comprising:
    depositing, over a supporting substrate, a first sequence of layers comprising, in order, a barrier layer or an adhesion layer, a first antiferromagnetic layer, a first magnetic growth layer, and a first soft magnetic layer;
    depositing an insulating non-magnetic spacer located between the first sequence of layers and a second sequence of layers;
    depositing the second sequence of layers comprising, in order, a second soft magnetic layer, a second magnetic growth layer, and a second antiferromagnetic layer; and
    pinning the first and second soft magnetic layers with, respectively, the first and second antiferromagnetic layers by subjecting the layers to annealing in a magnetic field;
    wherein the first soft magnetic layer is directly deposited on a surface of the first magnetic growth layer, and wherein the second magnetic growth layer is directly deposited on a surface of the second soft magnetic layer.

2. The method of claim 1, wherein the second antiferromagnetic layer is directly deposited on a surface of the second magnetic growth layer.

3. The method of claim 1, wherein the first and second antiferromagnetic layers are independently formed by depositing an alloy of manganese, an alloy comprising platinum and manganese, an alloy comprising iron and manganese, and an alloy comprising nickel and manganese.

4. The method of claim 1, wherein the first and second soft magnetic layers are formed by depositing a material comprising an element selected from the group consisting of CoFeB, CoWB, CoWP, CoP, CoMoP, CoMoB, NiFe, NiFeCo, and NiFeCo, and combinations thereof.

5. The method of claim 1, wherein the layers are deposited by sputtering.

* * * * *